United States Patent
Nishimoto et al.

(10) Patent No.: US 10,504,749 B2
(45) Date of Patent: Dec. 10, 2019

(54) SEMICONDUCTOR DEVICE

(71) Applicant: MITSUBISHI MATERIALS CORPORATION, Tokyo (JP)

(72) Inventors: Shuji Nishimoto, Saitama (JP); Yoshiyuki Nagatomo, Saitama (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 0 days.

(21) Appl. No.: 16/070,893

(22) PCT Filed: Feb. 7, 2017

(86) PCT No.: PCT/JP2017/004376
§ 371 (c)(1),
(2) Date: Jul. 18, 2018

(87) PCT Pub. No.: WO2017/150096
PCT Pub. Date: Sep. 8, 2017

(65) Prior Publication Data
US 2019/0027380 A1 Jan. 24, 2019

(30) Foreign Application Priority Data
Feb. 29, 2016 (JP) ................................. 2016-037085

(51) Int. Cl.
*H01L 27/15* (2006.01)
*H01L 21/52* (2006.01)
(Continued)

(52) U.S. Cl.
CPC .......... *H01L 21/52* (2013.01); *H01L 21/4867* (2013.01); *H01L 23/3735* (2013.01);
(Continued)

(58) Field of Classification Search
CPC ......... H01L 21/52; H01L 24/27; H01L 24/43; H01L 2224/32225; H01L 2224/48091;
(Continued)

(56) References Cited

U.S. PATENT DOCUMENTS

2010/0065962 A1* 3/2010 Bayerer ............ H01L 23/3735
257/703
2013/0328204 A1 12/2013 Zommer
(Continued)

FOREIGN PATENT DOCUMENTS

GB 1297046 A 11/1972
JP 2004-172378 A 6/2004
(Continued)

OTHER PUBLICATIONS

International Search Report dated Mar. 14, 2017, issued for PCT/JP2017/004376 and English translation thereof.
(Continued)

*Primary Examiner* — Tu-Tu V Ho
(74) *Attorney, Agent, or Firm* — Locke Lord LLP

(57) ABSTRACT

A semiconductor device of the present invention includes a circuit layer formed of a conductive material, a semiconductor element mounted on a first surface of the circuit layer, and a ceramic substrate disposed on a second surface of the circuit layer, in which a Ag underlayer having a glass layer and a Ag layer laminated on the glass layer is formed on the first surface of the circuit layer, and the Ag layer of the Ag underlayer and the semiconductor element are directly joined together.

5 Claims, 4 Drawing Sheets

(51) Int. Cl.
*H01L 23/00* (2006.01)
*H01L 23/373* (2006.01)
*H01L 21/48* (2006.01)

(52) U.S. Cl.
CPC ............... *H01L 24/08* (2013.01); *H01L 24/27* (2013.01); *H01L 24/29* (2013.01); *H01L 24/32* (2013.01); *H01L 24/43* (2013.01); *H01L 24/48* (2013.01); *H01L 24/80* (2013.01); *H01L 24/83* (2013.01); *H01L 24/03* (2013.01); *H01L 24/05* (2013.01); *H01L 2224/0345* (2013.01); *H01L 2224/03505* (2013.01); *H01L 2224/04* (2013.01); *H01L 2224/04026* (2013.01); *H01L 2224/05639* (2013.01); *H01L 2224/05644* (2013.01); *H01L 2224/08225* (2013.01); *H01L 2224/2732* (2013.01); *H01L 2224/2744* (2013.01); *H01L 2224/27505* (2013.01); *H01L 2224/27515* (2013.01); *H01L 2224/27618* (2013.01); *H01L 2224/2939* (2013.01); *H01L 2224/29082* (2013.01); *H01L 2224/29294* (2013.01); *H01L 2224/29339* (2013.01); *H01L 2224/29387* (2013.01); *H01L 2224/29388* (2013.01); *H01L 2224/32225* (2013.01); *H01L 2224/4809* (2013.01); *H01L 2224/48091* (2013.01); *H01L 2224/48227* (2013.01); *H01L 2224/73251* (2013.01); *H01L 2224/73265* (2013.01); *H01L 2224/8083* (2013.01); *H01L 2224/80203* (2013.01); *H01L 2224/80439* (2013.01); *H01L 2224/80895* (2013.01); *H01L 2224/8383* (2013.01); *H01L 2224/83192* (2013.01); *H01L 2224/83203* (2013.01); *H01L 2224/83424* (2013.01); *H01L 2224/83487* (2013.01); *H01L 2224/83895* (2013.01); *H01L 2924/12041* (2013.01); *H01L 2924/13055* (2013.01); *H01L 2924/181* (2013.01); *H01L 2924/3512* (2013.01)

(58) Field of Classification Search
CPC . H01L 2224/73265; H01L 2224/83192; H01L 2924/181
USPC .......................................................... 257/79
See application file for complete search history.

(56) References Cited

U.S. PATENT DOCUMENTS

| | | | |
|---|---|---|---|
| 2014/0287227 | A1 | 9/2014 | Kodama et al. |
| 2015/0255419 | A1* | 9/2015 | Nishimoto ............. H01L 24/32 257/773 |

FOREIGN PATENT DOCUMENTS

| | | |
|---|---|---|
| JP | 2006-202938 A | 8/2006 |
| JP | 2008-208442 A | 9/2008 |
| JP | 2009-267374 A | 11/2009 |
| JP | 2010-287869 A | 12/2010 |
| JP | 2012-109315 A | 6/2012 |
| JP | 2013-012706 A | 1/2013 |
| JP | 2013-211298 A | 10/2013 |
| JP | 2014-187251 A | 10/2014 |
| JP | 2015-109434 A | 6/2015 |

OTHER PUBLICATIONS

Supplementary European Search Report dated Jul. 3, 2019, issued for the European patent application No. 17759567.5.
Office Action dated Jul. 30, 2019, issued for the Japanese patent application No. 2016-037085 and English translation thereof.

* cited by examiner

SEMICONDUCTOR DEVICE

TECHNICAL FIELD

The present invention relates to a semiconductor device including a circuit layer formed of a conductive material and a semiconductor element mounted on this circuit layer.

Priority is claimed on Japanese Patent Application No. 2016-037085, filed on Feb. 29, 2016, the content of which is incorporated herein by reference.

BACKGROUND ART

Semiconductor devices such as an LED or a power module have a structure in which a semiconductor element is joined onto a circuit layer formed of a conductive material.

In a power semiconductor element for high power control which is used to control wind force power generation, electric vehicles, hybrid vehicles, and the like, the amount of heat generated is great, and thus, as a substrate mounting this power semiconductor element for high powder control, for example, a ceramic circuit substrate (a substrate for a powder module) including an insulating layer formed of a ceramic substrate of aluminum nitride (AlN), alumina ($Al_2O_3$), or the like and a circuit layer formed by disposing a metal having an excellent conductive property on first surface of this insulating layer has been broadly used in the related art.

For example, a power module (a semiconductor device) described in Patent Document 1 has a structure in which a substrate for a power module (a ceramic circuit substrate) having a circuit layer formed of a metal such as Al or Cu formed on a first surface of a ceramic substrate and a semiconductor element that is joined onto this circuit layer are provided. In addition, the power module has a constitution in which a heat dissipation plate is joined to the other side of the substrate for a power module and heat generated in the semiconductor element is transmitted toward the substrate for a power module and diffused to the outside through the heat dissipation plate.

When an electronic component such as a semiconductor element is joined onto a circuit layer, for example, a method in which a solder material is used as described in Patent Document 1 is broadly used. In recent years, from the viewpoint of environmental protection, for example, a lead-free solder such as a Sn—Ag-based solder material, a Sn—In-based solder material, or a Sn—Ag—Cu-based solder material has become mainstream.

Here, in a circuit layer formed of aluminum or an aluminum alloy, a natural oxide film of aluminum is formed on the surface, and thus it has been difficult to favorably join the circuit layer to a semiconductor element using a solder material.

In addition, in a circuit layer formed of copper or a copper alloy, there has been a concern that a molten solder material and copper may react with each other, a component of the solder material may intrude into the inside of the circuit layer, and the characteristics of the circuit layer may deteriorate.

Therefore, in the related art, a semiconductor element has been joined to the surface of a circuit layer using a solder material after a Ni-plated film is formed on the surface of a circuit layer as described in Patent Document 1.

Meanwhile, as a joining method in which no solder material is used, for example, Patent Document 2 proposes a technique for joining a semiconductor element using a Ag nano-paste.

In addition, for example, Patent Document 3 and 4 propose techniques for joining a semiconductor element using an oxide paste including metallic oxide particles and a reducing agent formed of an organic substance.

In addition, for example, Patent Document 5 to 7 propose a technique in which a Ag underlayer is formed on a circuit layer formed of aluminum or copper using a glass-containing Ag paste and then the circuit layer and a semiconductor element are joined together through a solder or the Ag paste. In this technique, the glass-containing Ag paste is applied and sintered on the surface of the circuit layer formed of aluminum or copper, whereby an oxide coating formed on the surface of the circuit layer is reacted with glass and removed so as to form a Ag underlayer, and the semiconductor element is joined onto the circuit layer on which the Ag underlayer is formed through the Ag joint layer formed of a sintered body of the solder or the Ag paste.

Here, the Ag underlayer includes a glass layer formed by the reaction between the glass and the oxide coating on the circuit layer and a Ag layer formed on the glass layer. In this glass layer, conductive particles are dispersed, and due to these conductive particles, the conductive property of the glass layer is ensured.

CITATION LIST

Patent Document

[Patent Document 1] Japanese Unexamined Patent Application, First Publication No. 2004-172378

[Patent Document 2] Japanese Unexamined Patent Application, First Publication No. 2006-202938

[Patent Document 3] Japanese Unexamined Patent Application, First Publication No. 2008-208442

[Patent Document 4] Japanese Unexamined Patent Application, First Publication No. 2009-267374

[Patent Document 5] Japanese Unexamined Patent Application, First Publication No. 2010-287869

[Patent Document 6] Japanese Unexamined Patent Application, First Publication No. 2012-109315

[Patent Document 7] Japanese Unexamined Patent Application, First Publication No. 2013-012706

SUMMARY OF INVENTION

Technical Problem

Meanwhile, in a case in which a semiconductor element and a circuit layer are joined together using a solder material as described in Patent Document 1 and Patent Document 5 and 6, when used in a high-temperature environment, there is a concern that some of the solder may melt and the joining reliability between the semiconductor element and the circuit layer may degrade.

Particularly, in recent years, compound semiconductor elements such as SiC or GaN, replacing silicon semiconductors, have been expected to be put into practical use, and the improvement of the heat resistance of semiconductor elements is anticipated, and thus the temperature at which semiconductor devices are used tends to increase, and it has been difficult to cope with the above-described tendency with a structure in which the semiconductor element and the circuit layer are joined together using a solder material as in the related art.

In addition, in a case in which a metallic paste and a metallic oxide paste are used as a joining material and a semiconductor element is joined through a joining layer formed of a sintered body of the metallic paste and the metallic oxide paste as described in Patent Document 2 to 4 and Patent Document 7, when held at a high temperature of, for example, 200° C. or higher or subjected to, for example, a thermal cycle reaching a high temperature of 200° C. or higher, there is a concern that the sintering of metal may proceed in the joining layer, Ag crystals (metallic crystals) may grow, loose portions and dense portions may be locally formed, voids may be generated in the joining layer, and the joining property may degrade.

The present invention has been made in consideration of the above-described circumstances, and an object of the present invention is to provide a semiconductor device which is excellent in terms of the joining reliability between a circuit layer and a semiconductor element and can be stably used even in the case of being used in a relatively high-temperature environment.

Solution to Problem

In order to achieve the above-described object by solving the above-described problems, a semiconductor device that is an aspect of the present invention is a semiconductor device including a circuit layer formed of a conductive material, a semiconductor element mounted on a first surface of the circuit layer, and a ceramic substrate disposed on a second surface of the circuit layer, in which a Ag underlayer having a glass layer and a Ag layer laminated on the glass layer is formed on the first surface of the circuit layer, and the Ag layer of the Ag underlayer and the semiconductor element are directly joined together.

According to the semiconductor device having the above-described constitution, the Ag underlayer having the glass layer and the Ag layer laminated on the glass layer is formed on the first surface of the circuit layer, and the Ag underlayer and the semiconductor element are directly joined together, and thus a solder material or a joining material formed of a metallic paste is not interposed therebetween, and, even in the case of being used in a high-temperature environment, no melting occurs between the circuit layer and the semiconductor element, voids are not generated due to the proceeding of sintering, and the circuit layer and the semiconductor element are reliably joined together. Therefore, the semiconductor device that is an aspect of the present invention can be stably used even in a high-temperature environment.

Here, in the semiconductor device that is an aspect of the present invention, on the surface of the semiconductor element which is joined to the Ag layer, any of a Au film formed of Au or a Au alloy and a Ag film formed of Ag or a Ag alloy is preferably formed.

In a case in which the Ag film is formed on the surface of the semiconductor element which is joined to the Ag layer, the Ag underlayer (the Ag layer) and the semiconductor element (the Ag film) become joining between metals of the same kind, and it is possible to favorably join the circuit layer and the semiconductor element. In a case in which the Au film is used on the surface of the semiconductor element which is joined to the Ag layer, it is possible to carry out solid-phase diffusion joining between the semiconductor element (the Au film) and the Ag underlayer (the Ag layer) at a relatively low temperature.

In addition, in the semiconductor device that is an aspect of the present invention, the semiconductor element may be a power semiconductor element.

According to the semiconductor device having the above-described constitution, even in the case of using a power semiconductor element from which a large amount of heat is generated, it is possible to efficiently transfer heat to the circuit layer. Meanwhile, examples of the power semiconductor include an insulated gate bipolar transistor (IGBT), MOSFET, and the like.

Advantageous Effects of Invention

According to the present invention, it is possible to provide a semiconductor device which is excellent in terms of the joining reliability between a circuit layer and a semiconductor element and can be stably used even in the case of being used in a relatively high-temperature environment.

DESCRIPTION OF EMBODIMENTS

Figure 1:
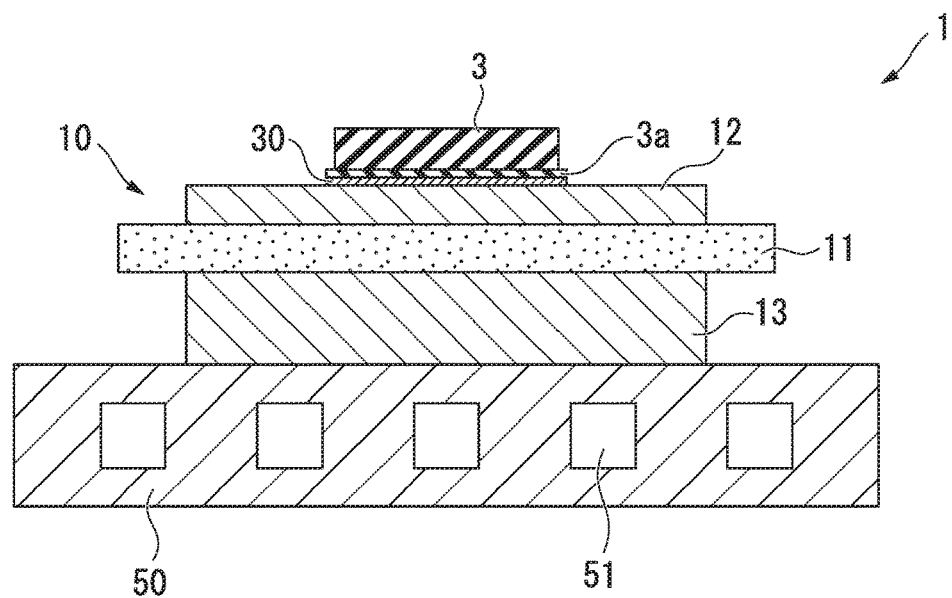
FIG. 1 is a schematic explanatory view of a semiconductor device (a power module) which is an embodiment of the present invention.

Hereinafter, embodiments of the present invention will be described with reference to the accompanying drawings. Meanwhile, a semiconductor device which is the present embodiment is a power module in which a power semiconductor element for high power control which is used to control wind force power generation, electric wheeled vehicles such as electric vehicles, and the like is mounted. FIG. 1 shows the power module (the semiconductor device) which is an embodiment of the present invention.

This power module 1 includes a substrate for a power module (a ceramic circuit substrate) 10 on which a circuit layer 12 is disposed, a semiconductor element 3 joined to first surface (an upper surface in FIG. 1) of the circuit layer 12, and a cooler 50 disposed on the other side of the substrate for a power module 10.

As shown in FIG. 1, the substrate for a power module 10 includes a ceramic substrate 11 constituting an insulating layer, the circuit layer 12 disposed on a first surface (an upper surface in FIG. 1) of the ceramic substrate 11, and a metallic layer 13 disposed on a second surface (a lower surface in FIG. 1) of the ceramic substrate 11.

The ceramic substrate 11 prevents electric connection between the circuit layer 12 and the metallic layer 13 and is constituted of highly insulating aluminum nitride (AlN), silicon nitride ($Si_3N_4$), alumina ($Al_2O_3$), or the like. In the present embodiment, the ceramic substrate is constituted of aluminum nitride (AlN) having an excellent heat dissipation property. In addition, the thickness of the ceramic substrate 11 is set to be in a range of 0.2 to 1.5 mm and, in the present embodiment, set to 0.635 mm.

The circuit layer 12 is formed by joining a metallic plate of aluminum, an aluminum alloy, copper, or a copper alloy which has a conductive property to a first surface of the ceramic substrate 11. In the present embodiment, the circuit layer 12 is formed by joining a rolled plate of aluminum having a purity of 99.99 mass % or more (so-called 4N aluminum) to the ceramic substrate 11. Meanwhile, the thickness of the circuit layer 12 is set to be in a range of 0.1 mm or more and 1.0 mm or less and, in the present embodiment, set to 0.6 mm. In addition, a circuit pattern is formed in the circuit layer 12, and a first surface thereof (the upper surface in FIG. 1) is used as a joint surface to which the semiconductor element 3 is joined.

The metallic layer 13 is formed by joining a metallic plate formed of aluminum, an aluminum alloy, copper, a copper alloy, or the like to a second surface of the ceramic substrate 11. In the present embodiment, as the metallic plate (the metallic layer 13), a rolled plate of aluminum having a purity of 99.99 mass % or more (so-called 4N aluminum) is used. Here, the thickness of the metallic layer 13 is set to be in a range of 0.2 mm or more and 3.0 mm or less and, in the present embodiment, set to 1.6 mm.

The cooler 50 is a member for cooling the substrate for a power module 10 and, in the present embodiment, includes a flow channel 51 for circulating a cooling medium (for example, cooling water). The cooler 50 is desirably constituted of a material having a favorable thermal conductive property and, in the present embodiment, constituted of A6063 (Al alloy).

The semiconductor element 3 is constituted of a semiconductor material such as Si, SiC, or GaN, and, on the joint surface with the circuit layer 12, a Au film formed of Au or a Au alloy and a Ag film formed of Ag or a Ag alloy are formed as a surface treatment film 3a. In the present embodiment, a Ag film is used as the surface treatment film 3a.

Here, in the present embodiment, the surface treatment film 3a is formed in a thickness of 20 nm to 300 nm using a sputtering method. The thickness of the surface treatment film 3a is preferably set to 50 nm to 200 nm, but is not limited thereto.

Figure 2:
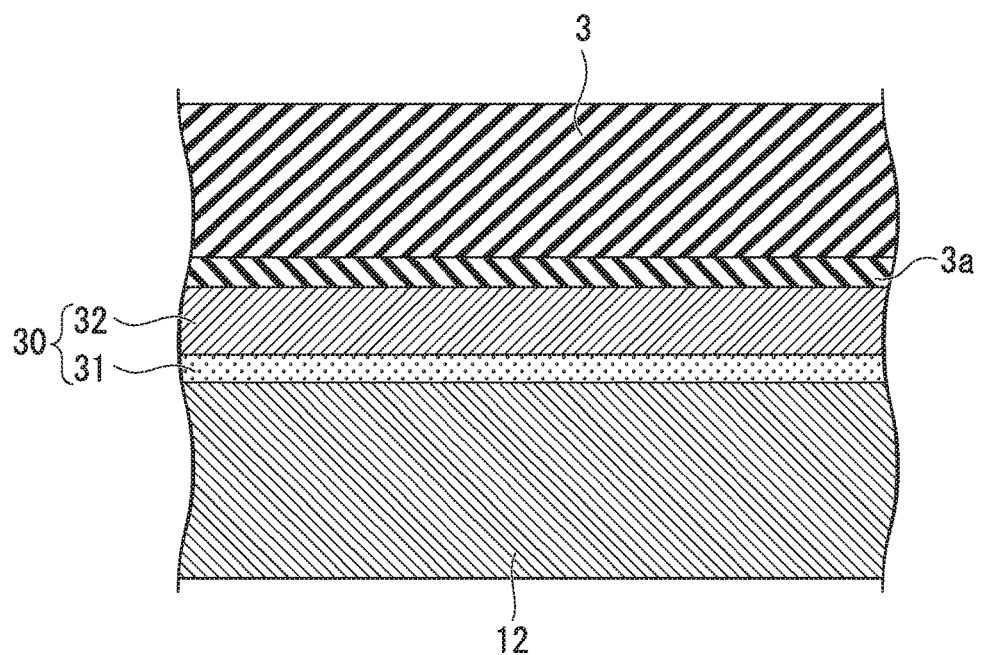
FIG. 2 is an enlarged explanatory view of a joint interface between a circuit layer and a semiconductor element of the semiconductor device (the power module) shown in FIG. 1.

In addition, in the power module 1 shown in FIG. 1, a Ag underlayer 30 is formed on the surface of the circuit layer 12 as shown in FIG. 2. Meanwhile, the Ag underlayer 30 is not formed throughout the entire surface of the circuit layer 12 as shown in FIG. 1 and is selectively formed only on a portion in which the semiconductor element 3 is disposed, that is, the joint surface with the semiconductor element 3.

Figure 3:
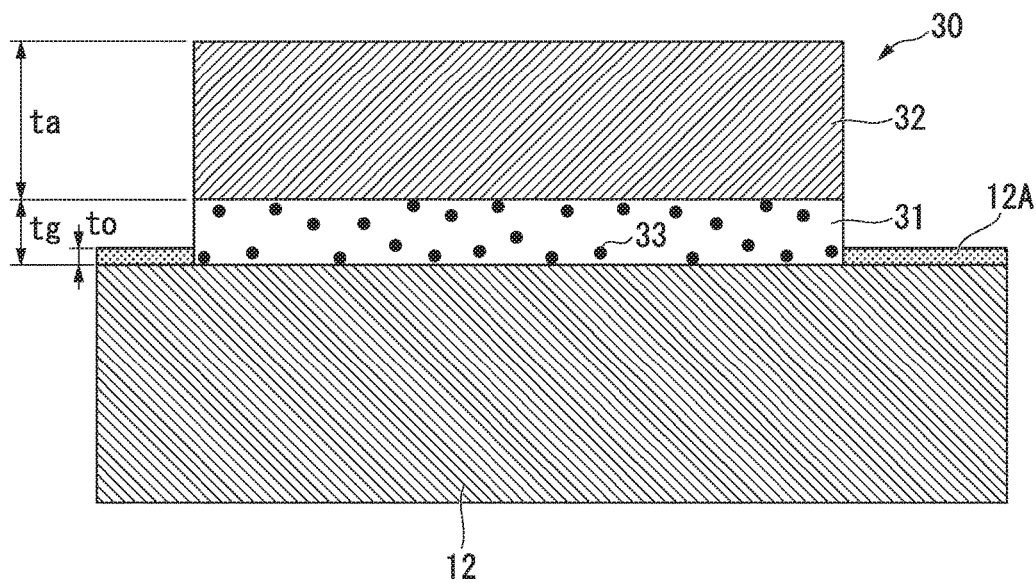
FIG. 3 is a main part enlarged cross-sectional view showing a joint portion between a Ag underlayer and a circuit layer.

Here, the Ag underlayer 30 is a sintered body of a glass-containing Ag paste including a glass component as described below. The Ag underlayer 30 includes a glass layer 31 formed on the circuit layer 12 side and a Ag layer 32 formed on the glass layer 31 in a state in which the semiconductor element 3 is joined to the Ag underlayer as shown in FIG. 3.

Inside the glass layer 31, fine conductive particles 33 having a particle diameter of approximately several nanometers are dispersed. These conductive particles 33 are crystalline particles containing at least one of Ag or Al. Meanwhile, the conductive particles 33 in the glass layer 31 are observed using, for example, a transmission electron microscope (TEM).

In addition, inside the Ag layer 32, fine glass particles having a particle diameter of approximately several nanometers (not shown) are dispersed.

In addition, in the present embodiment, the circuit layer 12 is constituted of aluminum having a purity of 99.99 mass % or more, and thus, on the surface of the circuit layer 12, an aluminum oxide coating 12A naturally generated in the atmosphere is formed. Here, in a portion in which the Ag underlayer 30 is formed, the aluminum oxide coating 12A has been removed, and the Ag underlayer 30 is directly formed on the circuit layer 12. That is, aluminum constituting the circuit layer 12 and the glass layer 31 are directly joined together as shown in FIG. 3.

In the present embodiment, as shown in FIG. 3, a thickness to of the aluminum oxide coating 12A that is naturally generated on the circuit layer 12 is set to be in a range of 4 nm to 6 nm. In addition, the Ag underlayer is constituted so that the thickness tg of the glass layer 31 is in a range of 0.01 μm to 5 μm and a thickness to of the Ag layer 32 is in a range of 1 μm to 100 μm.

Meanwhile, an electric resistance value P of the Ag underlayer 30 in a thickness direction is set to 0.5Ω or less. Here, in the present embodiment, the electric resistance value P of the Ag underlayer 30 in the thickness direction is an electric resistance value between an upper surface of the Ag underlayer 30 and an upper surface of the circuit layer 12. This is because the electric resistance of aluminum (4N aluminum) constituting the circuit layer 12 is extremely smaller than the electric resistance of the Ag underlayer 30 in the thickness direction. Meanwhile, in the measurement of the electric resistance, an electric resistance between an upper surface central point of the Ag underlayer 30 and a point on the circuit layer 12 which is apart from a Ag underlayer 30 end portion by the same distance as a distance from the upper surface central point of the Ag underlayer 30 to the Ag underlayer 30 end portion is measured.

Next, the glass-containing Ag paste forming the Ag underlayer 30 will be described.

The glass-containing Ag paste contains a Ag powder, a glass powder, a resin, a solvent, and a dispersant, the content of a powder component including the Ag powder and the glass powder is set to 60 mass % or more and 90 mass % or less of the entire glass-containing Ag paste, and the remainder is the resin, the solvent, and the dispersant.

Meanwhile, in the present embodiment, the content of the powder component including the Ag powder and the glass powder is set to 85 mass % of the entire glass-containing Ag paste.

In addition, the viscosity of the glass-containing Ag paste is preferably adjusted to 10 Pa·s or more and 500 Pa·s or less and more preferably adjusted to 50 Pa·s or more and 300 Pa·s or less.

The particle diameter of the Ag powder is set to 0.05 μm or more and 1.0 μm or less, and, in the present embodiment, a Ag powder having an average particle diameter of 0.8 μm was used.

The glass powder contains any one or more of, for example, lead oxide, zinc oxide, silicon oxide, boron oxide, phosphorus oxide, and bismuth oxide, the glass transition temperature is set to 300° C. or higher and 450° C. or lower, the softening temperature is set to 600° C. or lower, and the crystallization temperature is set to 450° C. or higher.

In the present embodiment, a glass powder that includes lead oxide, zinc oxide, and boron oxide as a main component and has an average particle diameter of 0.5 µm was used.

In addition, a weight ratio A/G of a weight A of the Ag powder to a weight G of the glass powder is adjusted in a range of 80/20 to 99/1, and, in the present embodiment, was set to A/G of 80/5.

As the solvent, a solvent having a boiling point of 200° C. or higher is appropriate, and, in the present embodiment, diethylene glycol dibutyl ether was used.

The resin adjusts the viscosity of the glass-containing Ag paste, and a resin that is decomposed at 400° C. or higher is appropriate. In the present embodiment, ethyl cellulose is used.

In addition, in the present embodiment, a dicarboxylic acid-based dispersant is added. Meanwhile, the glass-containing Ag paste may be constituted without adding any dispersants.

The glass-containing Ag paste is produced by preliminarily mixing a powder mixture obtained by mixing the Ag powder and the glass powder and an organic mixture obtained by mixing the solvent and the resin using a mixer with the dispersant, mixing the obtained preliminary mixture using a roll milling machine while being kneaded, and filtering the obtained kneaded substance using a paste filter.

Figure 4:
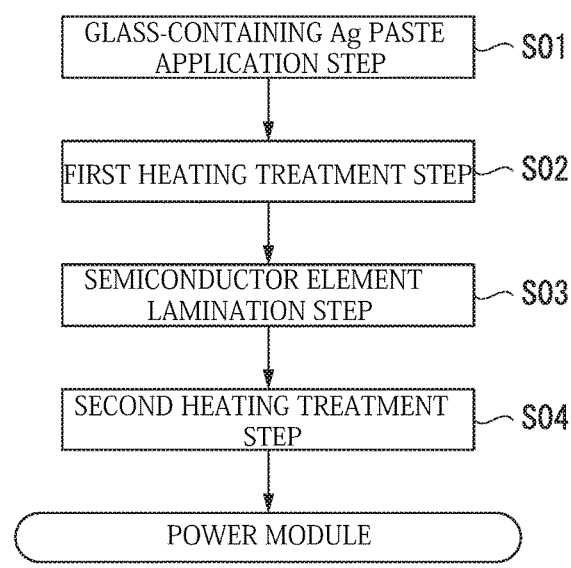
FIG. 4 is a flowchart showing a method for manufacturing the semiconductor device (the power module) shown in FIG. 1.

Next, a method for manufacturing the power module 1 which is the present embodiment will be described with reference to FIG. 4 and FIG. 5.

First, the substrate for a power module 10 having the circuit layer 12 formed on a first surface of the ceramic substrate 11 and the metallic layer 13 formed on a second surface of the ceramic substrate 11 is prepared, and a glass-containing Ag paste 40 is applied onto the circuit layer 12 of the substrate for a power module 10 (glass-containing Ag paste application step S01). Here, in the application of the glass-containing Ag paste 40, a variety of means such as a screen printing method, an offset printing method, and a photosensitive process can be employed. In the present embodiment, the glass-containing Ag paste 40 was formed in a pattern shape using a screen printing method.

The glass-containing Ag paste 40 is charged into a heating furnace 61 in a state of being applied onto a first surface of the circuit layer 12, a heating treatment is carried out, and the glass-containing Ag paste 40 is sintered (first heating treatment step S02). With this first heating treatment step S02, the Ag underlayer 30 including the glass layer 31 and the Ag layer 32 is formed.

In the first heating treatment step S02, during the sintering of the glass-containing Ag paste 40, an aluminum oxide coating 12A naturally generated on the surface of the circuit layer 12 is melted and removed by the glass layer 31, and the glass layer 31 is directly formed on the circuit layer 12. In addition, the fine conductive particles 33 having a particle diameter of approximately several nanometers are dispersed inside the glass layer 31. These conductive particles 33 are crystalline particles containing at least one of Ag or Al and are assumed to be precipitated inside the glass layer 31 during the sintering.

Furthermore, the glass particles having a particle diameter of approximately several micrometers are dispersed inside the Ag layer 32. These glass particles are assumed as particles generated by the agglomeration of a residual glass component in a process in which the sintering of the Ag particles proceeds.

In the present embodiment, the heating temperature in the first heating treatment step S02 is set to be in a range of 350° C. or higher and 645° C. or lower, and the holding time at the heating temperature is set to be in a range of 1 minute or longer and 60 minutes or shorter. In addition, the average crystal grain diameter of the Ag layer 32 in the Ag underlayer 30 to be formed after the first heating treatment step S02 is adjusted in a range of 0.5 µm or more and 3.0 µm or less by carrying out the heating treatment under the above-described conditions.

Here, in a case in which the heating temperature in the first heating treatment step S02 is lower than 350° C., and the holding time at the heating temperature is shorter than 1 minute, sintering becomes insufficient, and there is a concern that the Ag underlayer 30 cannot be sufficiently formed. On the other hand, in a case in which the heating temperature in the first heating treatment step S02 exceeds 645° C., and the holding time at the heating temperature exceeds 60 minutes, sintering proceeds excessively, and there is a concern that the average crystal grain diameter of the Ag layer 32 in the Ag underlayer 30 to be formed after the first heating treatment step S02 may not be in a range of 0.5 µm or more and 3.0 µm or less.

Based on the above description, in the present embodiment, the heating temperature in the first heating treatment step S02 is set to be in a range of 350° C. or higher and 645° C. or lower, and the holding time at the heating temperature is set to be in a range of 1 minute or longer and 60 minutes or shorter.

Meanwhile, in order to reliably form the Ag underlayer 30, the lower limit of the heating temperature in the first heating treatment step S02 is preferably set to 400° C. or higher and more preferably set to 450° C. or higher. In addition, the lower limit of the holding time at the heating temperature is preferably set to 5 minutes or longer and more preferably set to 10 minutes or longer.

On the other hand, in order to reliably suppress the proceeding of sintering in the first heating treatment step S02, the upper limit of the heating temperature in the first heating treatment step S02 is preferably set to 600° C. or lower and more preferably set to 575° C. or lower. In addition, the upper limit of the holding time at the heating temperature is preferably set to 45 minutes or shorter and more preferably set to 30 minutes or shorter. In addition, the average crystal grain diameter of the Ag layer 32 in the Ag underlayer 30 after the first heating treatment step S02 is adjusted in a range of 0.5 µm or more and 3.0 µm or less by carrying out the heating treatment under the above-described conditions.

Figure 5:
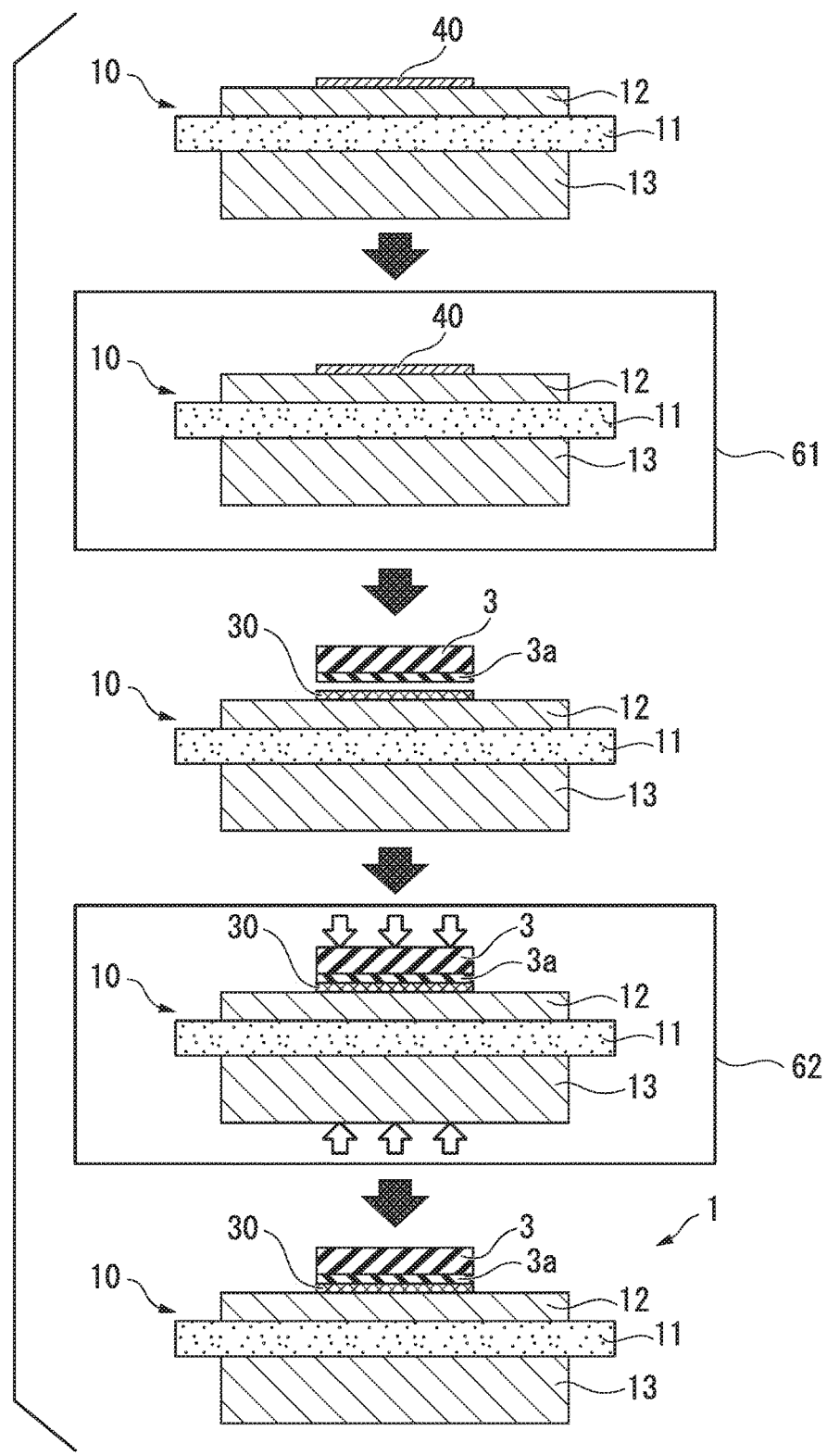
FIG. 5 is a schematic explanatory view of the method for manufacturing the semiconductor device (the power module) shown in FIG. 1.

Next, the semiconductor element 3 is laminated on the Ag layer 32 of the Ag underlayer 30 as shown in FIG. 5 (semiconductor element lamination step S03). At this time, the surface treatment film 3a of the semiconductor element 3 is disposed so as to face the Ag underlayer 30 side.

In addition, as shown in FIG. 5, the semiconductor element 3 and the substrate for a power module 10 laminated together are disposed in a heating furnace 62 in a state of being pressurized in the lamination direction, and a heating treatment is carried out, thereby joining the semiconductor element 3 and the substrate for a power module 10 (second heating treatment step S04). At this time, sintering further proceeds in the Ag layer 32 of the Ag underlayer 30, and the semiconductor element 3 is joined. That is, in the present embodiment, the Ag layer 32 of the Ag underlayer 30 is sintered by carrying out two stages of heating treatments of the first heating treatment step S02 and the second heating treatment step S04.

Here, in the second heating treatment step S04, the pressurization pressure in the lamination direction is set to be in a range of 5 MPa or more and 40 MPa or less, the heating temperature is set to in a range of 200° C. or higher and 400° C. or lower, and the holding time at the heating temperature is set to be in a range of 1 minute or longer and 60 minutes or shorter.

Meanwhile, in the second heating treatment step S04, the average crystal grain diameter of the Ag layer 32 does not change.

This is because the heating temperature in the second heating treatment step S04 is lower than in the first heating treatment step S02.

Here, in a case in which the pressurization pressure in the lamination direction in the second heating treatment step S04 is less than 5 MPa, there is a concern that the joining strength between the semiconductor element 3 and the circuit layer 12 may become insufficient. On the other hand, in a case in which the pressurization pressure in the lamination direction in the second heating treatment step S04 exceeds 40 MPa, there is a concern that cracks may be generated in the ceramic substrate 11.

Based on the above description, in the present embodiment, the pressurization pressure in the lamination direction in the second heating treatment step S04 is set to be in a range of 5 MPa or more and 40 MPa or less.

Meanwhile, in order to further improve the joining strength between the semiconductor element 3 and the circuit layer 12, the lower limit of the pressurization pressure in the lamination direction in the second heating treatment step S04 is preferably set to 10 MPa or more. In addition, in order to reliably suppress the generation of cracks in the ceramic substrate 11, the upper limit of the pressurization pressure in the lamination direction in the second heating treatment step S04 is preferably set to 35 MPa or less.

In addition, in a case in which the heating temperature in the second heating treatment step S04 is lower than 200° C., and the holding time at the heating temperature is shorter than 1 minute, there is a concern that the joining strength between the semiconductor element 3 and the circuit layer 12 may become insufficient. On the other hand, in a case in which the heating temperature in the second heating treatment step S04 exceeds 400° C., and the holding time at the heating temperature exceeds 60 minute, there is a concern that the characteristics of the semiconductor element 3 may deteriorate due to heat.

Based on the above description, in the present embodiment, the heating temperature in the second heating treatment step S04 is set to be in a range of 200° C. or higher and 400° C. or lower, and the holding time at the heating temperature is set to be in a range of 1 minute or longer and 60 minutes or shorter. The heating temperature in the second heating treatment step S04 is preferably set in a range of 250° C. or higher and 350° C. or lower, and the holding time at the heating temperature is preferably set in a range of 2 minutes or longer and 10 minutes or shorter, but the heating temperature and the holding time are not limited thereto.

With the above-described manufacturing method, the power module 1 which is the present embodiment in which the Ag layer 32 of the Ag underlayer 30 formed on the circuit layer 12 and the semiconductor element 3 are directly joined together is produced.

According to the power module (semiconductor device) 1 according to the present embodiment having the above-described constitution, the Ag underlayer 30 having the glass layer 31 and the Ag layer 32 laminated on the glass layer 31 is formed on a first surface of the circuit layer 12, and the Ag layer 32 of the Ag underlayer 30 and the semiconductor element 3 are directly joined together, and thus, even in the case of being used in a relatively-high temperature environment, the joining reliability between the circuit layer 12 and the semiconductor element 3 is excellent. Therefore, the power module 1 according to the present embodiment can be stably used even in a high-temperature environment.

In addition, in the present embodiment, the surface treatment film 3a formed of a Ag film is formed on the joint surface of the semiconductor element 3 with the Ag underlayer 30, and thus the Ag underlayer 30 (the Ag layer 32) and the semiconductor element 3 (the surface treatment film 3a) become joining between metals of the same kind, and it is possible to favorably join the circuit layer 12 and the semiconductor element 3.

Furthermore, in the present embodiment, the Ag layer 32 of the Ag underlayer 30 is sintered by carrying out two stages of heating treatments of the first heating treatment step S02 and the second heating treatment step S04, and the semiconductor element 3 is laminated and pressurized in the lamination direction in the second heating treatment step S04, and thus it becomes possible to favorably join the Ag layer 32 of the Ag underlayer 30 and the semiconductor element 3.

Hitherto, the embodiments of the present invention have been described, but the present invention is not limited thereto and can be appropriately modified within the scope of the technical concept of the invention.

For example, in the present embodiment, as the metallic plate constituting the circuit layer and the metallic layer, the rolled plate of pure having a purity of 99.99 mass % (4N aluminum) has been described, but the metallic plate is not limited thereto, and other metallic plates constituted of aluminum or an aluminum alloy may also be used. In addition, as the metallic plate constituting the circuit layer and the metallic layer, metallic plates constituted of copper or a copper alloy may also be used. Furthermore, a metallic plate having a structure in which a copper plate and an aluminum plate are joined together in a solid-phase diffusion manner may also be used.

In addition, as the insulating layer, the insulating layer for which the ceramic substrate formed of AlN is used has been described, but the insulating layer is not limited thereto, and a ceramic substrate formed of $Si_3N_4$, $Al_2O_3$, or the like may also be used, and the insulating layer may also be constituted of an insulating resin.

In addition, the heat sink is not limited to the heat sinks exemplified in the present embodiment, and the structure of the heat sink is not particularly limited.

Furthermore, a buffer layer may be provided between the heat sink and the metallic layer. As the buffer layer, it is possible to use a plate material formed of aluminum, an aluminum alloy, or a complex material including aluminum (for example, AlSiC or the like).

In addition, in the present embodiment, as the semiconductor device, the power module in which the power semiconductor element is mounted has been described as an example, but the semiconductor device is not limited thereto and may be a semiconductor device in which a semiconductor element is mounted on a circuit layer formed of a conductive material.

For example, the semiconductor device may be a thermoelectric conversion module in which a thermoelectric conversion element is used as the semiconductor element.

Figure 6:
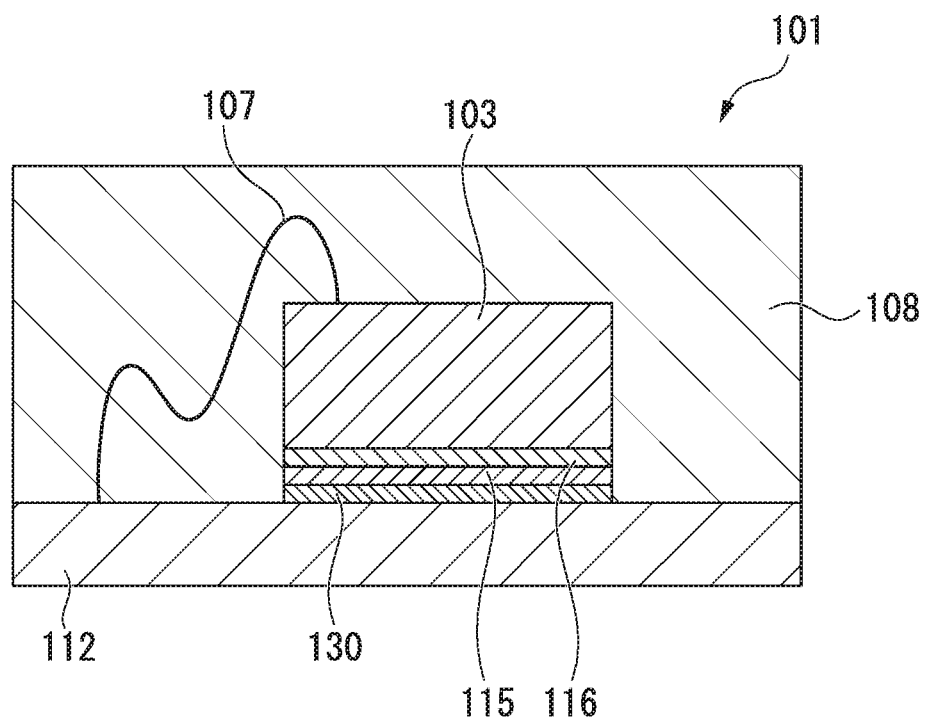
FIG. 6 is a schematic explanatory view of a semiconductor device (an LED device) which is another embodiment of the present invention.

In addition, for example, as shown in FIG. 6, the semiconductor device may also be an LED device (semiconductor device) in which an LED element (semiconductor element) is mounted.

An LED device 101 shown in FIG. 6 includes an LED element 103 and a circuit layer 112 formed of a conductive material. Meanwhile, the LED element 103 is electrically connected with the circuit layer 112 using a bonding wire 107, and the LED element 103 and the bonding wire 107 are sealed with a sealing material 108. A Ag underlayer 130 formed of a sintered body of a glass-containing Ag paste is provided on first surface of the circuit layer 112, and a conductive reflective film 116 and a protective film 115 are provided on a rear surface of the LED element 103. In addition, the LED element 103 is directly joined onto the Ag underlayer 130.

In the above-described LED device 101 as well, the Ag underlayer 130 is formed on first surface of the circuit layer 112, and the Ag underlayer 130 and the LED element 103 are directly joined together, and thus, even in a case in which the LED device is used in a high-temperature environment, the joining reliability between the circuit layer 112 and the LED element 103 is excellent.

EXAMPLES

A confirmation experiment carried out to confirm the effectiveness of the present invention will be described.

A metallic plate was joined to a first surface of a ceramic substrate, thereby forming a circuit layer. Here, as the ceramic substrate, a AlN substrate having a size of 27 mm×17 mm×0.6 mm was used. As the metallic plate which turned into the circuit layer, a material shown in Table 1 having a size of 25 mm×15 mm×0.3 mm was used.

Meanwhile, in a case in which the metallic plate is an aluminum plate, as a joining material, a Al—Si-based brazing material was used. In addition, in a case in which the metallic plate is a copper plate, as the joining material, an active metal brazing material (Ag—Cu—Ti brazing material) was used.

The glass-containing Ag paste described in the embodiment was applied to a surface of the circuit layer and heated under conditions shown in Table 1, thereby forming a Ag underlayer (first heating treatment step).

Meanwhile, as a glass powder in the glass-containing Ag paste, a lead-free glass powder including 90.6 mass % of $Bi_2O_3$, 2.6 mass % of ZnO, and 6.8 mass % of $B_2O_3$ was used. In addition, as a resin, ethyl cellulose was used, and, as a solvent, diethylene glycol dibutyl ether was used. Furthermore, a dicarboxylic acid-based dispersant was added thereto.

Here, a weight ratio A/G of a weight A of a Ag powder to a weight G of the glass powder in the glass-containing Ag paste and the amount of the paste applied were adjusted, and the thicknesses of a glass layer and a Ag layer were adjusted as shown in Table 1.

In addition, in the invention examples, a semiconductor element was laminated on the Ag underlayer, and a heating treatment was carried out under conditions shown in Table 1, thereby joining the semiconductor element to the circuit layer (second heating treatment step). The size of the semiconductor element was set to 5 mm×5 mm×0.2 mm.

Here, in Invention Examples 1 to 23 and Comparative Examples 1 and 2, a surface treatment film formed of a material shown in Table 1 was formed to a thickness of 100 nm using a sputtering method on a joint surface of the semiconductor element with the circuit layer.

Meanwhile, in Comparative Example 1, the Ag underlayer was not formed, a 2 μm-thick Ag plated layer was formed on the circuit layer, and the semiconductor element was joined thereonto.

In Comparative Example 2, the semiconductor element was laminated by applying a silver oxide paste onto the Ag underlayer, and a joint layer was formed by sintering the silver oxide paste, thereby joining the semiconductor element.

As the silver oxide paste, a paste obtained by mixing a commercially available silver oxide powder (manufactured by Wako Pure Chemical industries, Ltd.), myristyl alcohol as a reducing agent, 2,2,4-trimethyl-1,3-pentanediol mono (2-methylpropanoate) as a solvent in fractions of the silver oxide powder; 80 mass %, the reducing agent (myristyl alcohol); 10 mass %, and the solvent (2,2,4-trimethyl-1,3-pentanediol mono(2-methylpropanoate)); a remainder was used.

In addition, the thickness of the silver oxide paste applied was set to 50 μm, the sintering temperature was set to 300° C., and the sintering time was set to 10 minutes. Furthermore, the pressurization pressure in the lamination direction of the semiconductor element was set to 30 MPa.

(Average Ag Crystal Grain Diameter Below Element)

For semiconductor devices of the invention examples and the comparative examples described above, the average crystal grain diameters of the Ag layers after the joining of the semiconductor elements were measured by EBSD.

The EBSD measurement was carried out using EBSD measurement instruments (Quanta FEG 450 manufactured by FEI Company and OIM Data Collection manufactured by EDAX/TSL) and analysis software (OIM Data Analysis ver. 5.3 manufactured by EDAX/TSL) at an accelerated voltage of an electron beam of 20 kV and a measurement step of 0.05 μm.

(Joining Percentage Before and After Thermal Cycle)

For the semiconductor devices of the invention examples and the comparative examples, the joining percentages between the semiconductor element and the circuit layer were obtained from the following expression using ultrasonic test equipment. Here, an initial joining area refers to an area to be joined before joining, that is, the area of the semiconductor element. Peeled portions in an ultrasonic test image are indicated by white portions in the joint portion, and thus the area of the white portions was considered as the peeled area.

(Joining percentage)={(initial joining area)−(peeled area)}/(initial joining area)×100

Meanwhile, a thermal cycle test was carried out on the semiconductor device, and the initial joining percentage and the joining percentage after the thermal cycle test were compared with each other. In the thermal cycle, a cycle of −40° C. for 5 minutes and 200° C. for 15 minutes was repeated 3,000 times. The evaluation results are shown in Table 1.

TABLE 1

| | | Circuit layer | Element side Material of surface treatment film | First heating treatment step | | Crystal grain diameter (μm) | Ag underlayer | |
|---|---|---|---|---|---|---|---|---|
| | | | | Heating temperature (° C.) | Holding time (min) | | Glass layer (μm) | Ag layer (μm) |
| Invention Example | 1 | 4N aluminum | Ag | 400 | 10 | 0.5 | 0.2 | 8.5 |
| | 2 | 4N aluminum | Ag | 500 | 10 | 0.7 | 0.2 | 8.8 |
| | 3 | 4N aluminum | Ag | 600 | 10 | 1.1 | 0.2 | 8.7 |

TABLE 1-continued

|  |  |  | First heating treatment step (Ag underlayer forming step) |  |  |  |  |
|---|---|---|---|---|---|---|---|
|  |  | Metal plate | Underlayer metal | Heating temperature (°C) | Holding time (min) | Ag underlayer thickness (μm) | Average Ag crystal grain diameter (μm) | Ag underlayer joining percentage (%) |
|  | 4 | 4N aluminum | Ag | 550 | 1 | 0.8 | 0.2 | 8.9 |
|  | 5 | 4N aluminum | Ag | 550 | 10 | 0.8 | 0.2 | 8.8 |
|  | 6 | 4N aluminum | Ag | 550 | 30 | 0.9 | 0.2 | 8.8 |
|  | 7 | 4N aluminum | Ag | 550 | 60 | 1 | 0.2 | 8.9 |
|  | 8 | 4N aluminum | Ag | 550 | 10 | 0.8 | 0.2 | 8.8 |
|  | 9 | 4N aluminum | Ag | 550 | 10 | 0.8 | 0.2 | 8.9 |
|  | 10 | 4N aluminum | Ag | 550 | 10 | 0.8 | 0.2 | 9.1 |
|  | 11 | 4N aluminum | Ag | 550 | 10 | 0.8 | 0.2 | 8.9 |
|  | 12 | 4N aluminum | Ag | 550 | 10 | 0.8 | 0.2 | 9.4 |
|  | 13 | 4N aluminum | Ag | 550 | 10 | 0.8 | 0.2 | 9.3 |
|  | 14 | 4N aluminum | Ag | 550 | 10 | 0.8 | 0.2 | 9.3 |
|  | 15 | 4N aluminum | Ag | 550 | 10 | 0.8 | 0.2 | 9.1 |
|  | 16 | 4N aluminum | Ag | 550 | 10 | 0.8 | 0.2 | 9.3 |
|  | 17 | 4N aluminum | Ag | 550 | 10 | 0.8 | 0.2 | 9.5 |
|  | 18 | 4N aluminum | Ag | 550 | 10 | 0.8 | 0.2 | 9.3 |
|  | 19 | 4N aluminum | Ag | 550 | 10 | 0.8 | 0.2 | 9.4 |
|  | 20 | 4N aluminum | Ag | 550 | 10 | 0.8 | 0.2 | 9.4 |
|  | 21 | 4N aluminum | Ag | 550 | 10 | 0.8 | 0.2 | 9.6 |
|  | 22 | 4N aluminum | Au | 550 | 10 | 0.8 | 0.2 | 9.4 |
|  | 23 | Cu | Ag | 550 | 10 | 0.8 | 0.2 | 8.7 |
| Comparative Example | 1 | 4N aluminum | Ag | Ag plating | | | | |
|  | 2 | 4N aluminum | Ag | 550 | 10 | 0.8 | — | 8.8 |

| | | Second heating treatment step (element mounting step) | | | | | |
|---|---|---|---|---|---|---|---|
| | | Pressurization pressure (MPa) | Heating temperature (°C) | Holding time (min) | Average Ag crystal grain diameter below element (μm) | Joining percentage (%) Initial | Joining percentage (%) After thermal cycle |
| Invention Example | 1 | 25 | 300 | 10 | 0.5 | 91 | 86 |
| | 2 | 25 | 300 | 10 | 0.7 | 92 | 87 |
| | 3 | 25 | 300 | 10 | 1.1 | 94 | 89 |
| | 4 | 25 | 300 | 10 | 0.8 | 93 | 88 |
| | 5 | 25 | 300 | 10 | 0.8 | 94 | 89 |
| | 6 | 25 | 300 | 10 | 0.9 | 96 | 91 |
| | 7 | 25 | 300 | 10 | 1 | 98 | 93 |
| | 8 | 5 | 300 | 10 | 0.8 | 94 | 89 |
| | 9 | 10 | 300 | 10 | 0.8 | 95 | 90 |
| | 10 | 30 | 300 | 10 | 0.8 | 99 | 94 |
| | 11 | 40 | 300 | 10 | 0.8 | 99 | 94 |
| | 12 | 25 | 300 | 1 | 0.8 | 94 | 89 |
| | 13 | 25 | 300 | 10 | 0.8 | 95 | 90 |
| | 14 | 25 | 300 | 15 | 0.8 | 95 | 90 |
| | 15 | 25 | 300 | 45 | 0.8 | 96 | 91 |
| | 16 | 25 | 300 | 60 | 0.8 | 97 | 92 |
| | 17 | 25 | 200 | 30 | 0.8 | 88 | 84 |
| | 18 | 25 | 250 | 30 | 0.8 | 89 | 85 |
| | 19 | 25 | 300 | 30 | 0.8 | 93 | 88 |
| | 20 | 25 | 350 | 30 | 0.8 | 95 | 90 |
| | 21 | 25 | 400 | 30 | 0.8 | 98 | 93 |
| | 22 | 25 | 300 | 10 | 0.8 | 94 | 89 |
| | 23 | 25 | 300 | 10 | 0.8 | 94 | 89 |
| Comparative Example | 1 | 25 | 300 | 10 | — | 83 | 15 |
| | 2 | 30 | 300 | 10 | 0.2 | 93 | 31 |

*4N aluminum: aluminum having a purity of 99.99 mass % or more

In Comparative Example 1 in which the semiconductor element was joined onto the Ag plated layer and Comparative Example 2 in which the semiconductor element was joined onto the Ag underlayer using the silver oxide paste, the joining percentage after the thermal cycle significantly decreased. This is assumed to be because, in Comparative Example 2, when the thermal cycle reaching a high temperature of 200° C. was loaded, the crystal grain growth of Ag proceeded in the joint layer formed of the sintered body of the silver oxide paste, long cracks were generated in the Ag joint layer, and voids were generated, and thus the Ag joint layer was peeled off.

In contrast, in the invention examples in which the semiconductor element was directly joined onto the Ag underlayer, the joining percentage did not significantly change even after the thermal cycle. This is considered to be because the crystal grain growth of Ag did not develop due to the load of the thermal cycle.

The above description shows that, according to the invention examples, it is possible to provide a semiconductor device in which a circuit layer and a semiconductor element are reliably joined together and which can be stably used even in the case of being used in a relatively high-temperature environment.

INDUSTRIAL APPLICABILITY

According to the semiconductor device of the present invention, the semiconductor device is excellent in terms of the joining reliability between the circuit layer and the semiconductor element and can be stably used even in the case of being used in a relatively high-temperature environment.

REFERENCE SIGNS LIST

1 POWER MODULE (SEMICONDUCTOR DEVICE)
3 SEMICONDUCTOR ELEMENT
3a SURFACE TREATMENT FILM
10 SUBSTRATE FOR POWER MODULE
11 CERAMIC SUBSTRATE
12 CIRCUIT LAYER
30 Ag UNDERLAYER
31 GLASS LAYER
32 Ag LAYER

What is claimed is:

1. A semiconductor device comprising:
a circuit layer formed of a conductive material;
a semiconductor element mounted on a first surface of the circuit layer; and
a ceramic substrate disposed on a second surface of the circuit layer,
wherein a Ag underlayer having a glass layer and a Ag layer laminated on the glass layer is formed on the first surface of the circuit layer,
the Ag layer of the Ag underlayer and the semiconductor element are directly joined together,
conductive particles made of crystalline particles containing at least one of Ag or Al are dispersed inside the glass layer, and
glass particles are dispersed inside the Ag layer.

2. The semiconductor device according to claim 1,
wherein, on a surface of the semiconductor element which is joined to the Ag layer, any of a Au film formed of Au or a Au alloy and a Ag film formed of Ag or a Ag alloy is formed.

3. The semiconductor device according to claim 1,
wherein the semiconductor element is a power semiconductor element.

4. The semiconductor device according to claim 2,
wherein the semiconductor element is a power semiconductor element.

5. The semiconductor device according to claim 1,
wherein, an average crystal grain diameter of the Ag layer in the Ag underlayer is in a range of 0.5 μm or more and 3.0 μm or less.

* * * * *